United States Patent [19]

Smith

[11] 4,423,322
[45] Dec. 27, 1983

[54] SELF DIAGNOSTIC SWITCH CIRCUIT

[75] Inventor: Enoch P. Smith, Greendale, Wis.

[73] Assignee: Allen-Bradley Company, Milwaukee, Wis.

[21] Appl. No.: 305,121

[22] Filed: Sep. 24, 1981

[51] Int. Cl.³ .............................................. G01D 5/34
[52] U.S. Cl. ................................... 250/229; 340/619; 361/87; 250/231 SE
[58] Field of Search ............... 250/229, 206, 231 SE, 250/237 G, 214; 340/619, 664, 661; 361/87, 93, 173, 187; 307/360, 311

[56] References Cited

U.S. PATENT DOCUMENTS

| | | | |
|---|---|---|---|
| 4,065,669 | 12/1977 | Bogel | 250/229 |
| 4,177,394 | 12/1979 | Takasugi | 307/360 |
| 4,223,217 | 9/1980 | Bongard et al. | 250/227 |
| 4,291,356 | 9/1981 | Mathieu | 340/661 |

*Primary Examiner*—David C. Nelms
*Assistant Examiner*—J. Brophy
*Attorney, Agent, or Firm*—Quarles & Brady

[57] ABSTRACT

A switch circuit includes an input section which is connected to a detector section by a pair of leads. The input section draws a minimum current at all times through these leads and it draws more current when a shutter is operated to expose a photo sensor to a light source. The detector section senses the current level and thereby provides an indication of shutter operation. The detector section also indicates a fault condition when the minimum current is not drawn or excessive current is drawn.

3 Claims, 1 Drawing Figure

SELF DIAGNOSTIC SWITCH CIRCUIT

BACKGROUND OF THE INVENTION

The field of the invention is sensing devices for industrial control systems, and particularly, limit switch devices such as that described in U.S. Pat. Nos. 3,555,215 and 4,103,136.

Such limit switches include an arm, or other mechanical element, which is positioned to make contact with a moving portion of the industrial equipment being controlled. The arm is mechanically coupled to one or more sets of switch contacts and these are opened and closed in response to arm motion. The limit switch contacts may be wired into a control circuit comprised of relays, or they may be wired to the input modules of programmable controllers such as that described in U.S. Pat. No. 4,118,792, or numerical control systems such as that described in U.S. Pat. No. 4,263,647. Characteristically, such limit switches are employed in harsh environments and are required to operate millions of cycles. When a limit switch fails to operate properly, it may require that an entire assembly line be shut down, and thus, durability and reliability are of the utmost importance in limit switch design.

SUMMARY OF THE INVENTION

The present invention relates to a solid state switch which is suitable for use in industrial environments, and which not only provides signals indicative of the switch state under normal operating conditions, but also a signal which indicates that a malfunction has occurred. More specifically, the invention includes a power supply for supplying current through leads, means for detecting the amount of power delivered by the power supply, a light sensor connected in series circuit with a first current drain across the power supply leads and being operable when light is received to conduct current, a second current drain connected across the power supply leads for conducting a preselected amount of current, light emitting means connected to conduct current supplied by the power supply through its leads and being positioned to emit light on the light sensor, and shutter means positioned to block the light when physically operated. The detecting means indicates the switch is "open" when the supplied current equals that of the second current drain and it indicates that the switch is "closed" if it equals the sum of the first and second current drains. A fault condition is indicated if the supplied current is less than the first current drain (open circuit condition) or greater than the summed current drains (short circuit condition).

A general object of the invention is to provide a reliable sensing device for industrial control applications. Mechanical parts subject to wear are replaced in large part by solid state electronic components. The mechanical structure for operating the shutter requires a few moving parts, and the solid state components are durable and reliable.

Another object of the invention is to provide a sensing device which promptly indicates a fault condition. The level detector may provide a fault indicating signal which is used to illuminate a light, or the signal may be employed in a more sophisticated diagnostic scheme which forms part of a control system. In either case, when a malfunction occurs, the problem can be isolated quickly and repaired with minimal down-time.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
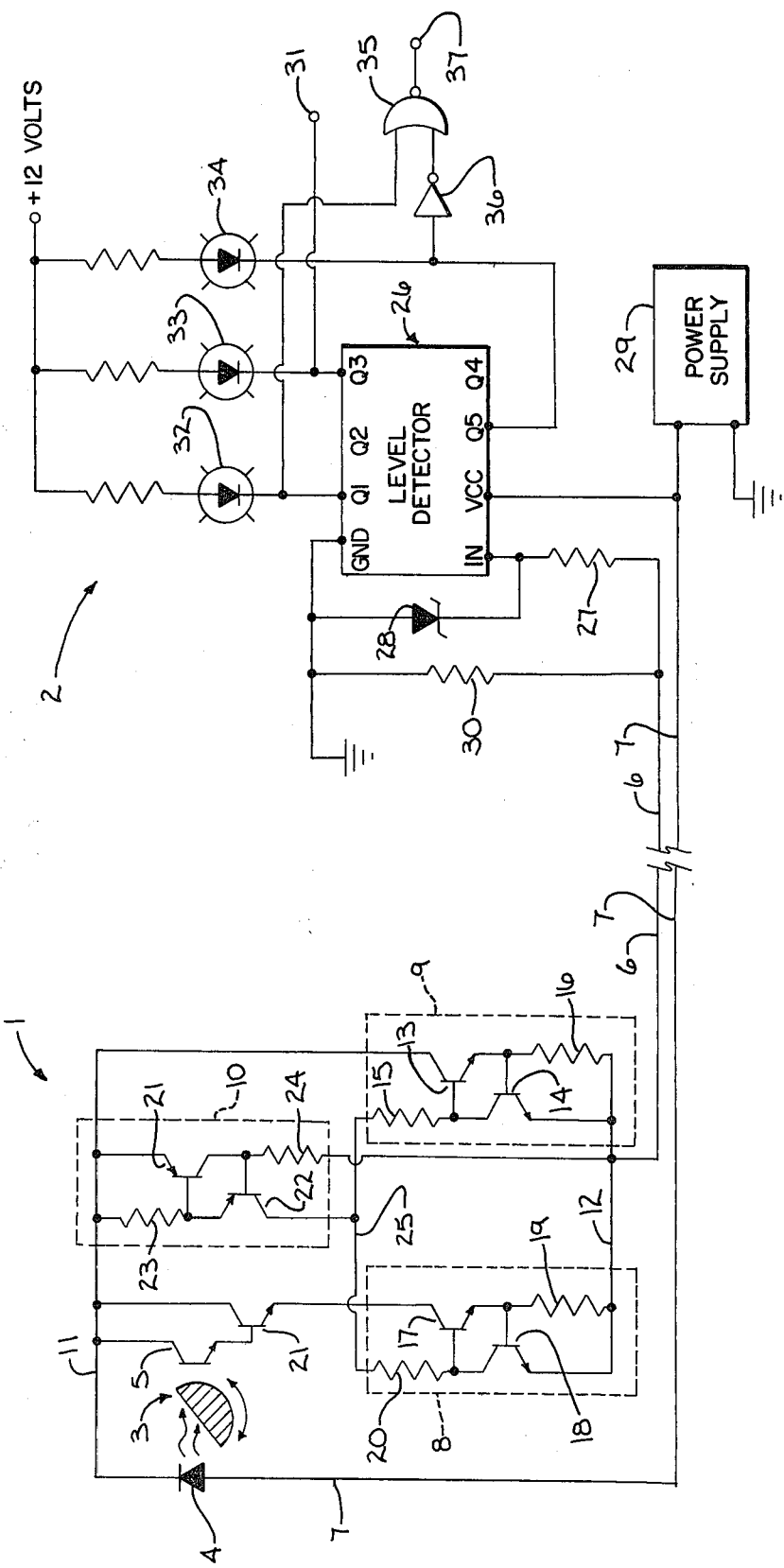
FIG. 1 is an electrical schematic diagram of the switch circuit of the present invention.

The switch is physically divided into an input section 1 and a detector section 2. The input section 1 includes a shutter mechanism 3 which is mechanically operated between an open position in which it blocks light emitted by a diode 4 from reaching the base of a phototransistor 5, and a closed position in which light reaches the phototransistor 5. Mechanically, the shutter 3 can take a number of forms and the precise structure is not pertinent to the present invention. In the preferred embodiment, however, the input section 1 is housed in a limit switch such as those disclosed in U.S. Pat. Nos. 3,555,215 and 4,103,136 and the shutter 3 is rotated by an arm (not shown in the drawings) which engages and is pivoted by the equipment being controlled.

In contrast, the detector section 2 is located with the control circuitry which operates the system. For example, it may form part of an input circuit on a programmable controller such as that described in U.S. Pat. No. 4,118,792. In any case, the detector section 2 is housed in an enclosure which protects it from the industrial environment and it is connected by a pair of wires 6 and 7 to the input section 1.

In addition to the light emitting diode 4 and phototransistor 5, the input circuit 1 includes a first current drain circuit 8, a second current drain circuit 9 and a constant current source 10. The lead 7 from the detector section 2 conducts positive current to the diode 4 and this current is in turn applied to a positive bus 11. The other lead 6 from the detector section 2 connects to a negative bus 12 in the input section 1 and current flows through the circuit elements to this bus.

The second current drain circuit 9 is formed by a pair of transistors 13 and 14 and resistors 15 and 16 which operate to conduct a relatively constant current of six milliamperes between the buses 11 and 12. The first current drain circuit 8 is similarly constructed with a pair of transistors 17 and 18 and resistors 19 and 20 and it is connected in series circuit with a transistor 21 across the buses 11 and 12. The transistor 21 is driven by the phototransistor 5, and when light is received, current flows through this series branch. The first current drain circuit 8 limits this current to eight milliamperes when the transistor 21 is saturated.

The constant current source 10 serves to provide a stable bias current to the current drains 8 and 9. It includes a pair of transistors 21 and 22 and resistors 23 and 24 which connect across the buses 11 and 12. A relatively stable voltage is thus maintained on a line 25 which drives the current drains 8 and 9.

Regardless of the position of the shutter 3, the current drain 9 draws 6 milliamperes through the leads 6 and 7. When the "switch" closes allowing light to reach the phototransistor 5, current is also drawn by the current source 8 until the total current reaches a level of fourteen milliamperes. Thus under normal operating conditions, when the swithc is open the current level in the leads 6 and 7 is at 6 milliamperes, and when the switch 5 is closed, the current level is at 14 milliamperes. On the other hand, if a malfunction should occur, the current level will drop 6 milliamperes in the case of an open circuit, or rise above 14 milliamperes in the case of a short circuit.

By connecting the light emitting diode 4 in series circuit with the lead 7, a regenerative action is achieved which improves switch operation. More specifically, as the shutter 3 revolves to permit light to reach the phototransistor 5, more current is drawn through the lead 7 by the current drain 8. This increases the light emitted by the diode 4, which in turn further increases current flow. A sharp, or rapid, turn-on characteristic is thus achieved. The same sharp transition to the off state occurs when the shutter 3 is revolved to block light from the diode 4. During this transition the current level through the lead 7 drops and the diode 4 generates less light to cause a continued drop in current level until the current drain 8 is non-conductive.

The leads 6 and 7 which connect the two sections 1 and 2 provide power to the input section 1 and communicate the state of the input section 1 to the detector section 2 in the form of a current level. The leads 6 and 7 may be a pair of twisted wires which extend over considerable distance in an industrial environment.

The detector section 2 is formed around a 5-step analog level detector 26 which senses the current flowing in the leads 6 and 7. The level detector 26 is commercially available in integrated circuit form as the type TL489C manufactured by Texas Instruments, Inc. and it includes an analog input which is connected to the lead 6 through a resistor 27. A protective zener diode 28 also connects to this input and a power supply 29 provides regulated twelve volt d.c. power to the level detector 26. The power supply 29 also provides current to the input section 1 through the leads 6 and 7 and this current flows through a current sense resistor 30. The voltage developed across the resistor 30 is proportional to the current flow in the leads 6 and 7, and it is this voltage which is input to the level detector 26. The power supply 29 may include a current limiting feature which protects it from short circuit conditions.

The level detector 26 includes five outputs Q1–Q5 which switch to a logic low voltage when the input voltage exceeds successive levels. The values of resistors 27 and 30 are chosen such that the output Q1 goes low when at least four milliamperes is drawn by the input section 1 and output Q5 goes low when more than twenty milliamperes is drawn. The output Q3 switches at a current level of twelve milliamperes and it drives a switch output lead 31 to provide a logic level signal which indicates the state of the switch circuit. The respective outputs Q1, Q3 and Q5 also connect through light emitting diodes 32, 33 and 34 to a twelve volt supply to provide a visual indication of their logic state. The output Q5 connects to one input of a NOR gate 35 through an inverter gate 36 and the output Q1 drives the other input. The NOR gate 35 drives a fault line 37 to a logic low voltage when the current supplied to the input section 1 drops below four milliamperes or rises above twenty milliamperes.

TABLE A

| | | | |
|---|---|---|---|
| 12 ma < | I < | 20 ma | switch on |
| 4 ma < | I < | 12 ma | switch off |
| | I < | 4 ma | fault condition |
| | I > | 20 ma | fault condition |

The operation of the self diagnostic switch is summarized by TABLE A. It should be apparent that the indicated current levels can be easily altered to meet specific operating conditions by adjusting the current drain circuits in the input section 1, and by adjusting the current levels required to alter the level detector outputs. The fault line 37 may be connected to drive fault detection circuitry in a control system, or it may be employed to directly drive an interrupt line on a microprocessor. The switch output 31 may connect directly to the control system or it may be coupled to the control system through an opto-isolator which provides high voltage protection.

I claim:

1. A switch circuit which comprises:
    a power supply connected to provide current through leads;
    means coupled to the leads for detecting the amount of current delivered by the power supply;
    a series circuit connected across said leads and including a light sensor connected in series with a first current drain, the series circuit being operable when light is received at the light sensor to conduct current;
    a second current drain connected across the leads and in parallel with the series circuit, the second current drain being operable to conduct a preselected minimum amount of current;
    light emitting means connected to conduct current which is supplied by the power supply through the leads and being positioned to emit light on the light sensor;
    shutter means positioned to block the light applied to the light sensor when the shutter means is in one operating position and to allow the light to be applied to the light sensor when the shutter means is in a second operating position;
    wherein the means for detecting the amount of current delivered by the power supply includes:
    first means for providing an indication that the current has dropped below a level less than that conducted by the second current drain;
    second means for providing an indication that the current has risen above a level which is greater than the sum of the currents conducted by the first and second current drains; and
    third means for providing an indication that the current has reached a level which is greater than that conducted by the second current drain, but less than the sum of the currents conducted by the first and second current drains.

2. The switch circuit as recited in claim 1 in which the means for detecting the amount of current delivered by the power supply includes gate means coupled to the first and second means to provide a fault indication signal when either of the first or second means provides an indication.

3. The switch circuit as recited in claim 1 in which the light emitting means is connected to the power supply leads to conduct the current supplied to said first and second current drains.

* * * * *